United States Patent
Patel et al.

(10) Patent No.: US 10,090,938 B2
(45) Date of Patent: Oct. 2, 2018

(54) MULTI-BAND COMBINER WITH PIM DETECTION

(71) Applicant: CommScope Italy S.R.L., Agrate Brianza (IT)

(72) Inventors: Sammit A. Patel, Dallas, TX (US); Ray K. Butler, Allen, TX (US); John W. Brunner, Ramona, CA (US); Xiaohua Hou, Shanghai (CN)

(73) Assignee: CommScope Italy, S.r.l. (IT)

( * ) Notice: Subject to any disclaimer, the term of this patent is extended or adjusted under 35 U.S.C. 154(b) by 0 days.

(21) Appl. No.: 15/526,592

(22) PCT Filed: Jan. 6, 2015

(86) PCT No.: PCT/IB2015/000352
§ 371 (c)(1),
(2) Date: May 12, 2017

(87) PCT Pub. No.: WO2016/110727
PCT Pub. Date: Jul. 14, 2016

(65) Prior Publication Data
US 2017/0324485 A1    Nov. 9, 2017

(51) Int. Cl.
*H04B 1/18* (2006.01)
*H04B 15/04* (2006.01)
(Continued)

(52) U.S. Cl.
CPC ............ *H04B 15/04* (2013.01); *G01R 23/20* (2013.01); *H04B 1/26* (2013.01); *H04B 1/0092* (2013.01); *H04B 17/12* (2015.01)

(58) Field of Classification Search
CPC ...... H04B 1/0475; H04B 1/10; H04B 1/1027; H04B 1/1036; H04B 1/16
See application file for complete search history.

(56) References Cited

U.S. PATENT DOCUMENTS

2013/0054169 A1* 2/2013 Neidhardt .......... H04B 17/0085
702/69
2013/0310023 A1* 11/2013 Bevan .................. H04B 1/1027
455/423
(Continued)

FOREIGN PATENT DOCUMENTS

CN          202002984 U    10/2011
WO   WO 2014/012585 A1    1/2014
WO    WO 2014012585 A1 *  1/2014    ........... H04B 17/104

OTHER PUBLICATIONS

International Search Report, International Application No. PCT/IB2015/000352, dated Sep. 18, 2015.
(Continued)

*Primary Examiner* — Tuan Pham
(74) *Attorney, Agent, or Firm* — Myers Bigel, P.A.

(57) ABSTRACT

For wireless cellular communications, a "smart" multi-band combiner system has a multi-band combiner and a passive inter-modulation (PIM) detection sub-system. The multi-band combiner combines multiple transmit signals in different downlink frequency bands into a single, multi-band transmit signal for transmission from a cell tower antenna. The PIM detection sub-system characterizes the frequency components in the multi-band transmit signal to predict PIM products and determine if any predicted PIM products might interfere with any receive signals in any uplink frequency bands. If so, the PIM detection sub-system generates a signal indicating the presence of such predicted interfering PIM products, and the system installer and/or the network administrator can take remedial action to prevent the PIM products from interfering with user communications.

18 Claims, 2 Drawing Sheets

(51) Int. Cl.
    *G01R 23/20*     (2006.01)
    *H04B 1/26*     (2006.01)
    *H04B 17/12*     (2015.01)
    *H04B 1/00*     (2006.01)

(56) References Cited

U.S. PATENT DOCUMENTS

| | | | |
|---|---|---|---|
| 2014/0119197 A1* | 5/2014 | Maca | H04B 17/0085 370/241 |
| 2015/0171902 A1* | 6/2015 | Fleischer | H04B 1/525 375/285 |

OTHER PUBLICATIONS

Written Opinion of the International Searching Authority, International Application No. PCT/IB2015/000352, dated Sep. 18, 2015.

\* cited by examiner

100

200

10,090,938 B2

MULTI-BAND COMBINER WITH PIM DETECTION

CROSS REFERENCE TO RELATED APPLICATION

This application is a 35 U.S.C. § 371 national stage application of PCT International Application No. PCT/IB2015/000352, filed on Jan. 6, 2015, the disclosure and content of which is incorporated by reference herein in its entirety. The above-referenced PCT International Application was published in the English language as International Publication No. WO 2016/110727 A1 on Jul. 14, 2016.

BACKGROUND

Field of the Invention

The present invention relates to electronics and, more specifically but not exclusively, to multi-band combiners for wireless cellular communications.

Description of the Related Art

This section introduces aspects that may help facilitate a better understanding of the invention. Accordingly, the statements of this section are to be read in this light and are not to be understood as admissions about what is prior art or what is not prior art.

In wireless cellular communications, each cell tower may be used to support multiple technologies (e.g., GSM, CDMA, WCDMA, LTE, etc.) deployed in different frequency bands (e.g., 800 MHz, 900 MHz, 1900 MHz, etc.). In such situations, a multi-band combiner may be used to combine multiple transmit (i.e., downlink) signals in multiple different downlink frequency bands for simultaneous transmission from a single antenna. Such di/tri/quad/penta band-plexers employed at the base of the cell tower reduce the number of RF feeder runs between the radios at the base of the tower and the antenna(s) at the top of the tower. Using such multi-band combiners significantly reduces the capital expenditure by combining different bands with each multi-band combiner and running the resulting, single, combined signal to the antenna.

Combining different bands at different frequencies into a single multi-band signal generates passive inter-modulation (PIM) products at various frequencies. These PIM products can constitute interfering noise if one or more of them (i) fall within one or more of the uplink frequency bands and (ii) are strong enough to desensitize the corresponding radio receiver(s).

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

This disclosure describes a "smart" multi-band combiner system that generates signals that can warn system installers and/or network administrators of the potential existence of interfering PIM products.

Figure 1:
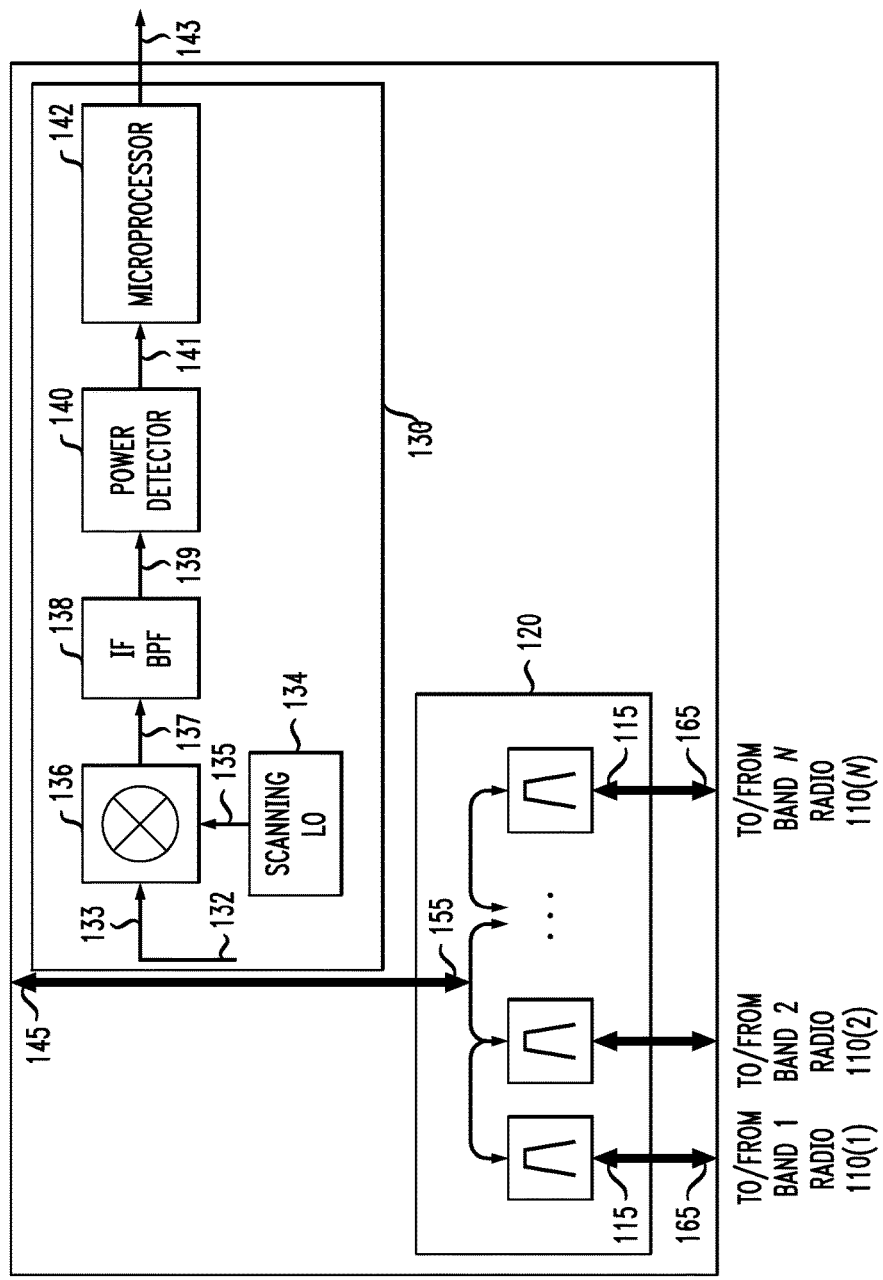
FIG. 1 is a block diagram of a "smart" multi-band combiner system according to certain embodiments of the disclosure.

FIG. 1 is a block diagram of a "smart" multi-band combiner system 100 according to certain embodiments of the disclosure. Multi-band combiner system 100 receives and combines (i.e., multiplexes) N>1 different radio frequency (RF) transmit (i.e., downlink) signals 115 in N different (typically non-overlapping) downlink frequency bands from N respective radios 110 (e.g., located at the base of a cellular tower) to generate a combined, multi-band, RF transmit signal 145 that is sent to an antenna 150 (e.g., located at the top of the cellular tower) for wireless transmission in a cellular communications network. Depending on the particular implementation, radios 110 could be either time-division duplexing (TDD) or frequency-division duplexing (FDD) radios.

In addition, multi-band combiner system 100 receives and separates (i.e., de-multiplexes) a combined, multi-band, RF receive (i.e., uplink) signal 155 from antenna 150 to generate N different RF receive signals 165 in N different (typically non-overlapping) uplink frequency bands that are sent to the N respective radios 110. Note that the N different downlink frequency bands are typically interleaved with, but do not overlap with the N different uplink frequency bands.

As shown in FIG. 1, multi-band combiner system 100 has a conventional multi-band combiner 120 and a PIM detection sub-system 130. Combiner 120 performs the signal multiplexing and de-multiplexing operations described in the previous two paragraphs. In certain implementations, PIM detection sub-system 130 characterizes the frequency components of the combined RF transmit signal 145 and predicts whether those frequency components will generate PIM products that could interfere with the ability of the different radios 110 to process the different RF receive signals 165. If so, then PIM detection sub-system 130 generates a signal 143 that can notify the installer and/or the network administrator of that possibility.

In the particular architecture shown in FIG. 1, coupler 132 of PIM detection sub-system 130 taps a small portion 133 of the combined, multi-band, RF transmit signal 145. Mixer 136 downconverts the tapped, multi-band RF signal 133 to a multi-band, downconverted intermediate frequency (IF) signal 137 based on a mixing signal 135 from a local oscillator (LO) 134. The multi-band IF signal 137 is applied to IF band-pass filter (BPF) 138 (e.g., a surface acoustic wave (SAW) filter), which attenuates signal components having IF frequencies above and below the passband of BPF 138 to produce narrowband IF signal 139. Power detector 140 (e.g., a root mean square (RMS) or log detector) determines the power in narrowband IF signal 139 and provides the determined power level value 141 to processor 142 (e.g., a microprocessor), which stores the determined power level value 141 for subsequent processing.

Local oscillator 134 is a (e.g., programmable or configurable) scanning LO that is capable of selectively generating mixing signal 135 to have any one of a sufficient number of different frequencies in a sufficiently wide frequency range to be able to selectively and sequentially convert a sufficient number and variety of frequency components in the combined, multi-band, RF transmit signal 145 to the passband frequency of IF BPF 138.

By programming, configuring, or otherwise controlling scanning LO 134 to generate a sequence of a sufficient number of different mixing signals 135 having appropriate frequencies, PIM detection sub-system 130 will be able to characterize the power levels at different frequencies across the spectrum of combined, multi-band, RF transmit signal 145. After scanning LO 134 scans across the spectrum, processor 142 processes the stored power level values 141 for the different frequencies to predict the frequencies of PIM products produced by those different characterized frequency components in the RF transmit signal 145. In particular, processor 142 determines the frequencies of the PIM products based on the "measured" downlink frequencies going through combiner 120. Once processor 142 has determined the downlink frequencies going through the combiner, the processor will use a set of known equations to determine the 3rd-order products (and possibly higher-order products) based on the downlink frequencies going through the combiner. The processor will then compare the calculated products with the paired uplink bands. If there is any overlap between the paired uplink bands and the calculated products, then there is a potential issue and some kind of alarm or notification 143 will be sent from the processor.

Processor 142 is also aware (e.g., by independent programming) of the different uplink frequency bands associated with the combined RF receive signal 155. If processor 142 determines that any of the predicted PIM products (i) are within any of the uplink frequency bands and (ii) have power levels greater than specified corresponding threshold levels, then processor 142 outputs some suitable form of warning signal 143 to notify the system installer and/or the network administrator of the existence of such predicted interfering PIM products, e.g., by illuminating a light-emitting diode (LED) and/or transmitting warning messages over an appropriate signaling path. Depending on the particular implementation, processor 142 could specifically identify the affected frequencies and their associated PIM power levels.

The network administrator would then have the option of taking some remedial action to avoid the potential interfering PIM problem. For example, the network administrator could restrict wireless users from transmitting at the affected uplink frequencies. Alternatively, the network administrator could restrict the transmit power levels at the associated downlink frequencies to ensure that the magnitudes of the PIM products are below the threshold levels.

Figure 2:
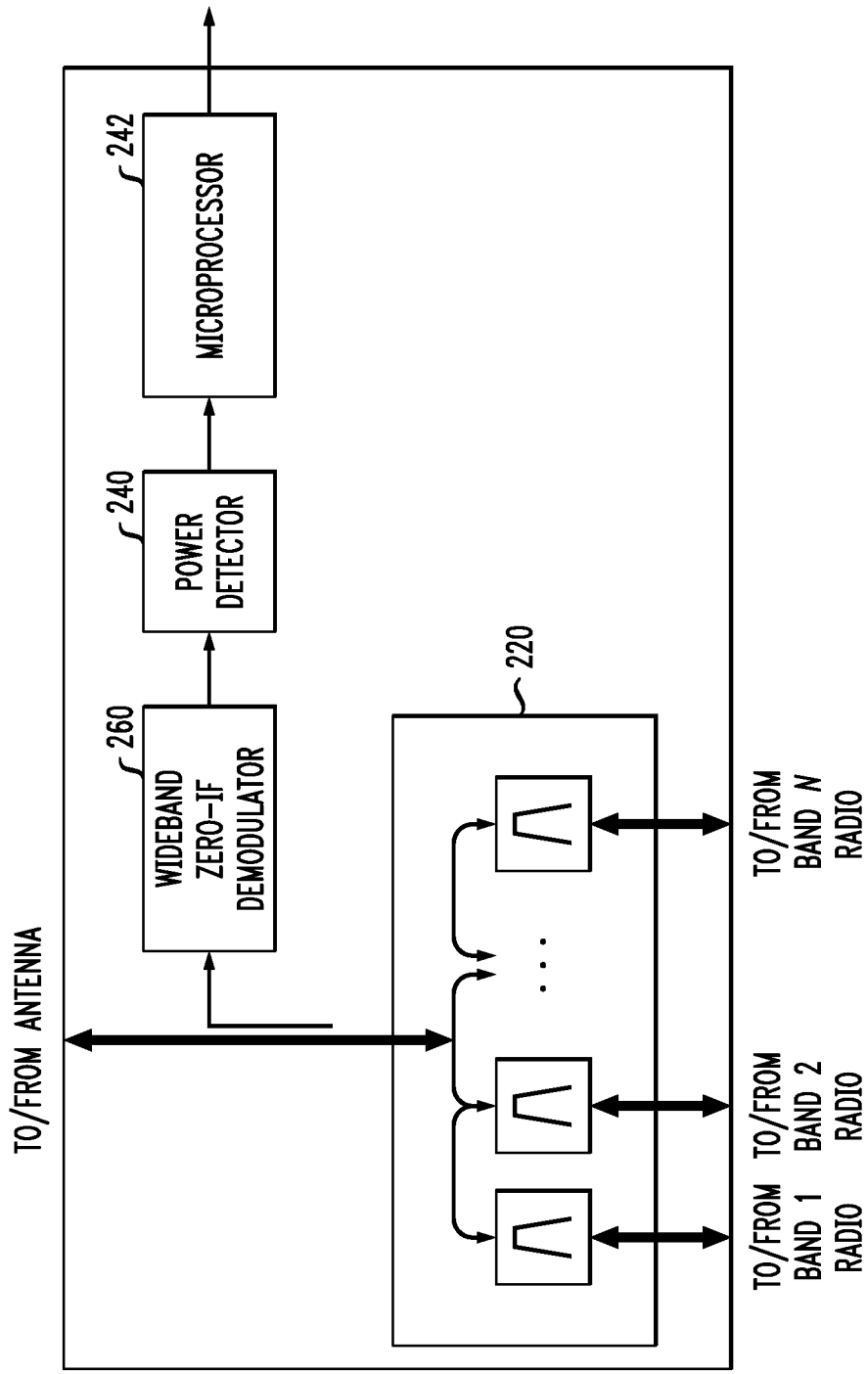
FIG. 2 is a block diagram of a "smart" multi-band combiner system according to certain other embodiments of the disclosure.

FIG. 2 is a block diagram of a "smart" multi-band combiner system 200 according to certain other embodiments of the disclosure. Like multi-band combiner system 100 of FIG. 1, multi-band combiner system 200 has a conventional multi-band combiner 220 that (i) receives and combines N>1 different RF transmit signals in N different downlink frequency bands from N respective radios to generate a combined, multi-band, RF transmit signal that is sent to an antenna and (ii) receives and separates a combined, multi-band, RF receive signal from the antenna to generate N different RF receive signals in N different uplink frequency bands that are sent to the N respective radios. Instead of the super-heterodyne receiver configuration of local oscillator 134, mixer 136, and IF band-pass filter 138 of multi-band combiner system 100, multi-band combiner system 200 has a wideband, zero-IF demodulator 260, such as those used in conventional cell phones. Like the super-heterodyne receiver of FIG. 1, wideband, zero-IF demodulator 260 sequentially generates different narrow-band signals corresponding to different subsets of the frequencies in the combined, multi-band, RF transmit signal for detection by power detector 240 and subsequent processing by microprocessor 242. In some implementations, demodulator 260, power detector 240, and microprocessor 242, are implemented in a single chipset with multi-band combiner 220 being implemented external to that single chipset. In some other implementations, the entire receiver, including multi-band combiner 220, demodulator 260, power detector 240, and microprocessor 242, is implemented in a single chipset.

The disclosure has been described in the context of multi-band combiner systems 100 and 200 of FIGS. 1 and 2, in which the multi-band combiners 120 and 220 both multiplex transmit signals and de-multiplex receive signals. In other embodiments, the multi-band combiner does not de-multiplex the receive signals, which are processed using other components (not shown in FIGS. 1 and 2).

Instead of using a scanning local oscillator and a band-pass filter to selectively and sequentially determine the power of different frequency components in the combined, multi-band RF transmit signal 145 as in FIG. 1, a PIM detection sub-system could be implemented using a filter bank that converts the time-domain tapped multi-band signal 133 into a suitable frequency domain, where the magnitudes of the different frequency components are determined and used to predict the PIM products.

Embodiments of the invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, micro-controller, general-purpose computer, or other processor.

The functions of the various elements shown in the figures, including any functional blocks labeled as "processors," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A multi-band combiner system comprising:
a multi-band combiner that combines transmit signals in multiple different transmit frequency bands to form a combined, multi-band, transmit signal; and
a PIM detection sub-system that includes a downconverter that characterizes frequency components of the combined, multi-band, transmit signal to (i) predict whether there will be one or more interfering passive inter-modulation (PIM) products and, if so, (ii) generate a signal indicating the presence of the one or more interfering PIM products;
wherein the PIM detection sub-system characterizes the frequency components of the combined, multi-band, transmit signal to predict whether any PIM products will interfere with any receive frequency bands.

2. A multi-band combiner system comprising:
a multi-band combiner that combines transmit signals in multiple different transmit frequency bands to form a combined, multi-band, transmit signal; and
a PIM detection sub-system that characterizes frequency components of the combined, multi-band, transmit signal to (i) predict whether there will be one or more interfering passive inter-modulation (PIM) products and, if so, (ii) generate a signal indicating the presence of the one or more interfering PIM products,
wherein the PIM detection sub-system comprises: a coupler that taps the combined, multi-band, transmit signal to provide a tapped, multi-band signal; a receiver that generates a narrow-band signal corresponding to a subset of frequencies in, the tapped, multi-band signal; a power detector that measures power of the narrow-band signal; and a processor that (i) collects the measured powers of different narrow-band signals corresponding to different frequencies of the combined, multi-band, transmit signal and (ii) predicts PIM products from the measured powers at the afferent frequencies.

3. The system of claim 2, wherein the processor determines whether magnitude of the predicted PIM product for a particular frequency exceeds a specified threshold level for the particular frequency.

4. The system of claim 2, wherein the receiver is a super-heterodyne receiver.

5. The system of claim 4, wherein the super-heterodyne receiver comprises: a mixer that downconverts the tapped, multi-band signal into a downconverted, multi-band signal; and a band-pass filter that converts the downconverted, multi-band signal into a narrow-band signal.

6. The system of the claim 5, wherein the super-heterodyne receiver further comprises a scanning oscillator that sequentially applies different mixing signals having different frequencies to the mixer to generate a sequence of downconverted multi-band signals (i) corresponding to different subsets of frequencies in the combined, multi-band, transmit signal and (ii) having similar frequencies corresponding to a passband of the band-pass filter.

7. The system of claim 2, wherein the receiver is a wideband, zero-IF demodulator that generates a set of narrow-band signals corresponding to different subsets of frequencies in the tapped, multi-band signal.

8. A multi-band combiner system comprising:
a multi-band combiner that is configured to combine transmit signals in multiple different transmit frequency bands to form a combined, multi-band transmit signal;
a PIM detection sub-system that includes (i) a first circuit that is configured to determine the frequencies of the transmit signals and (ii) a second circuit that is configured to predict whether there will be one or more interfering passive inter-modulation (PIM) products; and
wherein the PIM detection sub-system further comprising a coupler that is configured to tap a portion of the combined, multi-band transmit signal and to provide the tapped portion of the combined, multi-band transmit signal to the first circuit.

9. The multi--band combiner system of claim 8, wherein the first circuit comprises a downconverter.

10. The multi-band combiner system of claim 9, wherein the first circuit further comprises a bandpass filter that is coupled to an output of the downconverter.

11. The multi-band combiner system of claim 10, wherein the first circuit further comprises a power detector that is coupled to an output of the bandpass filter.

12. The multi-band combiner system of claim 8, wherein the second circuit comprises a processor.

13. The multi-band combiner system of claim 12, wherein the processor is configured to (i) determine the predicted third order PIM products and (ii) determine if any of the predicted third order PIM products fall within one or more uplink frequency bands.

14. A method of predicting if a multiband combiner will generate third order passive intermodulation (PIM) products in an uplink band of a communications system, the method comprising:
- inputting a plurality of transmit signals in multiple different transmit frequency bands to the multiband combiner to form a combined, multi-band transmit signal;
- determining the frequencies of the transmit signals;
- calculating the third order PIM products using the determined frequencies of the transmit signals using a set of equations; and
- determining if the calculated products will fall within an uplink frequency band.

15. The method of claim 14, wherein deteunining the frequencies of the transmit signals comprises:
- using a coupler to tap a portion of the combined, multi-band transmit signal;
- downconverting the portion of the combined, multi-band transmit signal to a plurality of different intermediate frequencies; and
- passing each downconverted portion of the combined, multi-band transmit signal to a filter.

16. The method of claim 15, wherein the filter is a narrowband bandpass filter.

17. The method of claim 14, wherein determining the frequencies of the'transmit signals comprises:
- using a coupler to tap a portion of the combined, multi-band transmit signal; and
- passing the portion of the combined, multi-band transmit signal to a demodulator that is configured to generate different narrowband signals.

18. The method of claim 14, further comprising determining a predicted power level of each of the calculated third order PIM products.

* * * * *

UNITED STATES PATENT AND TRADEMARK OFFICE
CERTIFICATE OF CORRECTION

PATENT NO. : 10,090,938 B2
APPLICATION NO. : 15/526592
DATED : October 2, 2018
INVENTOR(S) : Patel et al.

Page 1 of 1

It is certified that error appears in the above-identified patent and that said Letters Patent is hereby corrected as shown below:

In the Claims

Column 6, Claim 2, Line 3: Please correct "tapped," to read -- tapped --

Column 6, Claim 2, Line 5: Please correct "in," to read -- in --

Column 6, Claim 2, Line 11: Please correct "afferent" to read -- different --

Column 6, Claim 9, Line 53: Please correct "multi--band" to read -- multi-band --

Column 7, Claim 15, Line 14: Please correct "deteuriining" to read -- determining --

Column 8, Claim 17, Line 9: Please correct "the 'transmit" to read -- the transmit --

Signed and Sealed this
Fifteenth Day of January, 2019

Andrei Iancu
*Director of the United States Patent and Trademark Office*